United States Patent
Bian

(10) Patent No.: US 10,854,743 B2
(45) Date of Patent: Dec. 1, 2020

(54) VDMOS DEVICE AND MANUFACTURING METHOD THEREFOR

(71) Applicant: CSMC TECHNOLOGIES FAB2 CO., LTD., Jiangsu (CN)

(72) Inventor: Zheng Bian, Jiangsu (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 36 days.

(21) Appl. No.: 16/329,663

(22) PCT Filed: Aug. 9, 2017

(86) PCT No.: PCT/CN2017/096597
§ 371 (c)(1),
(2) Date: Feb. 28, 2019

(87) PCT Pub. No.: WO2018/040866
PCT Pub. Date: Mar. 8, 2018

(65) Prior Publication Data
US 2019/0198665 A1    Jun. 27, 2019

(30) Foreign Application Priority Data

Aug. 31, 2016 (CN) .......................... 2016 1 0789301

(51) Int. Cl.
*H01L 29/78* (2006.01)
*H01L 29/66* (2006.01)
(52) U.S. Cl.
CPC .... *H01L 29/7813* (2013.01); *H01L 29/66734* (2013.01); *H01L 29/78* (2013.01)
(58) Field of Classification Search
CPC ......... H01L 29/66712–66734; H01L 29/4236; H01L 29/78; H01L 29/7831; H01L 29/7802–7815
See application file for complete search history.

(56) References Cited

U.S. PATENT DOCUMENTS

2011/0233659 A1   9/2011  Tai
2013/0270630 A1  10/2013  Zara
2016/0104797 A1   4/2016  Poelzl et al.

FOREIGN PATENT DOCUMENTS

CN    103236439 A    8/2013
CN    103377929 A   10/2013
(Continued)

OTHER PUBLICATIONS

International Search Report issued for International Patent Application No. PCT/CN2017/096597, dated Nov. 15, 2017, 5 pages including English translation.
(Continued)

*Primary Examiner* — Tucker J Wright
(74) *Attorney, Agent, or Firm* — Hamre, Schumann, Mueller & Larson, P.C.

(57) ABSTRACT

A VDMOS device and a manufacturing method therefor. The manufacturing method comprises: forming a groove in a semiconductor substrate, the groove comprising a first groove area, a second groove area, a third groove area, a fourth groove area and a fifth groove area; successively forming a first insulation layer, a first polycrystalline silicon layer and a second insulation layer on the semiconductor substrate; removing some of the second insulation layer until the first polycrystalline silicon layer is exposed; removing some of the first polycrystalline silicon layer, the remaining first polycrystalline silicon layer forming a first electrode; forming a third insulation layer on the semiconductor substrate, removing some of the third insulation layer, the second insulation layer and the first insulation layer, so that the top of the first polycrystalline silicon layer is higher than the top of the first insulation layer and the second insulation layer; and successively forming a gate oxide layer and a second polycrystalline silicon layer on the semiconductor substrate, and removing some of the second polycrystalline (Continued)

silicon layer, exposing the gate oxide layer located on the surface of the semiconductor substrate and the top of the second insulation layer, the remaining second polycrystalline silicon layer forming a second electrode.

15 Claims, 9 Drawing Sheets

(56) References Cited

FOREIGN PATENT DOCUMENTS

| | | |
|---|---|---|
| CN | 203288599 U | 11/2013 |
| CN | 105097545 A | 11/2015 |
| WO | 2015114803 | 8/2015 |

OTHER PUBLICATIONS

Extended European Search Report issued for European Patent Application No. 17845168.8, dated Apr. 3, 2020, 7 pages.

VDMOS DEVICE AND MANUFACTURING METHOD THEREFOR

TECHNICAL FIELD

The present disclosure relates to semiconductor manufacturing processes, and in particular to Vertical Double-diffused Metal-Oxide Semiconductor (VDMOS) Field Effect Transistor devices and methods for manufacturing the same.

BACKGROUND

At present, the technology of charge balance is introduced into the trench-type VDMOS products, and the structure of the split-gate device is something can be easily effected based on the existing technology. For split-gate technology, due to its dual gate design, which needs to be drawn to different electrodes (source and gate), the deep trench-like gate in the middle is connected to the source by way of connecting to the source metal through a direct punch-through, the shallow trench-like gate on the side is led out to the periphery of the active region and then punched out by way of increasing the polysilicon lithography layer. This requires additional polysilicon lithography to separate the two gates as compared to conventional trench-type VDMOS, thereby increasing processing costs, resulting that the leading-out of the shallow trench-like gate to be above the wafer plane and a certain step is formed, which affects the implementation of the subsequent process to some extent.

SUMMARY

Accordingly, it is necessary to provide a VDMOS device and a method for manufacturing the same that separate leading-out of the gate first and second electrodes can be effected without increasing the polysilicon lithography layers.

A method for manufacturing a VDMOS device includes:

forming a trench in a semiconductor substrate, the trench including a first trench region, a second trench region, a third trench region, and a fourth trench region communicating the first trench region and the second trench region, and a fifth trench region communicating the second trench region and the third trench region; a width of the second trench region is greater than a width of the first trench region, a width of the first trench region is greater than widths of the third trench region, the fourth trench region, and the fifth trench region;

forming a first insulating layer on the semiconductor substrate, the first insulating layer filling up the third trench region and the fifth trench region, and being attached to sidewalls of the first trench region, the second trench region, and the fourth trench region;

forming a first polysilicon layer on the first insulating layer, the first polysilicon layer filling up the first trench region, being attached to a sidewall of the first insulating layer in the second trench region, and the first polysilicon layer in the first trench region being connected to the first polysilicon layer in the second trench region;

forming a second insulating layer on the first polysilicon layer, the second insulating layer filling up the second trench region;

removing a portion of the second insulating layer until the first polysilicon layer being exposed;

removing a portion of the first polysilicon layer, a remaining first polysilicon layer forming a first electrode;

forming a third insulating layer on the semiconductor substrate, the third insulating layer filling up the first trench region, the second trench region, and the fourth trench region;

removing portions of the third insulating layer, the second insulating layer, and the first insulating layer such that a top of the first polysilicon layer being higher than tops of the first insulating layer and the second insulating layer;

forming a gate oxide layer on the semiconductor substrate;

forming a second polysilicon layer on the gate oxide layer, and the second polysilicon layer filling up the trench; and removing a portion of the second polysilicon layer, exposing the gate oxide layer on the surface of the semiconductor substrate and the top of the second insulating layer, and the remaining second polysilicon layer forming a second electrode In addition, there is provided a VDMOS device includes:

a semiconductor substrate comprising a trench, the trench comprising a first trench region, a second trench region, a third trench region, a fourth trench region communicating the first trench region and the second trench region, and a fifth trench region communicating the second trench region and the third trench region; a width of the second trench region is greater than a width of the first trench region, the width of the first trench region is greater than widths of the third trench region, the fourth trench region, and the fifth trench region;

the first trench region comprising therein a first electrode serving as a deep gate formed by a first polysilicon layer, a first insulating layer wrapping the first electrode, a second electrode serving as a shallow gate formed by a second polysilicon layer on a top of the first electrode, and a gate oxide layer between the first electrode and the second polysilicon layer;

the second trench region comprising therein a first electrode serving as a deep gate formed by a first polysilicon layer, a first insulating layer and a second insulating layer separated by the first electrode, a second electrode serving as a shallow gate formed by a second polysilicon layer and on a top of the first electrode, and a gate oxide layer between the first electrode and the second polysilicon layer;

the third trench region comprising at a bottom thereof a first insulating layer, a second electrode serving as a shallow gate formed by a second polysilicon layer on a top of the first insulating layer, and a gate oxide layer wrapping the second electrode;

the fourth trench region comprising therein a first electrode serving as a deep gate formed by a first polysilicon layer and a first insulating layer wrapping the first electrode, a second electrode serving as a shallow gate formed by a second polysilicon layer on a top of the first electrode, and a gate oxide layer between the first electrode and the second polysilicon layer; and the fifth trench region comprising at a bottom thereof a first insulating layer, a second electrode serving as a shallow gate formed by a second polysilicon layer on a top of the first insulating layer, and a gate oxide layer wrapping the second electrode According to the manufacturing method for the VDMOS device, the separate leading-out of the first and second electrodes of the gate can be effected without increasing the polysilicon lithography layers, also, all the polysilicon gates remain in the trench. Therefore, there is no obvious step formed on the surface of the product, and the implementation difficulties of subsequent photolithography and etching process are somewhat reduced.

BRIEF DESCRIPTION OF THE DRAWINGS

To illustrate the technical solutions according to the embodiments of the present disclosure or in the prior art more clearly, the accompanying drawings for describing the embodiments or the prior art are introduced briefly in the following. Apparently, the accompanying drawings in the following description are only some embodiments of the present disclosure, and persons of ordinary skill in the art can derive other drawings from the accompanying drawings without creative efforts.

DETAILED DESCRIPTION OF THE EMBODIMENTS

Embodiments of the application are described more fully hereinafter with reference to the accompanying drawings. The various embodiments of the application may, however, be embodied in many different forms and should not be construed as limited to the embodiments set forth herein. Rather, these embodiments are provided so that this disclosure will be thorough and complete, and will fully convey the scope of the application to those skilled in the art.

Figure 1:
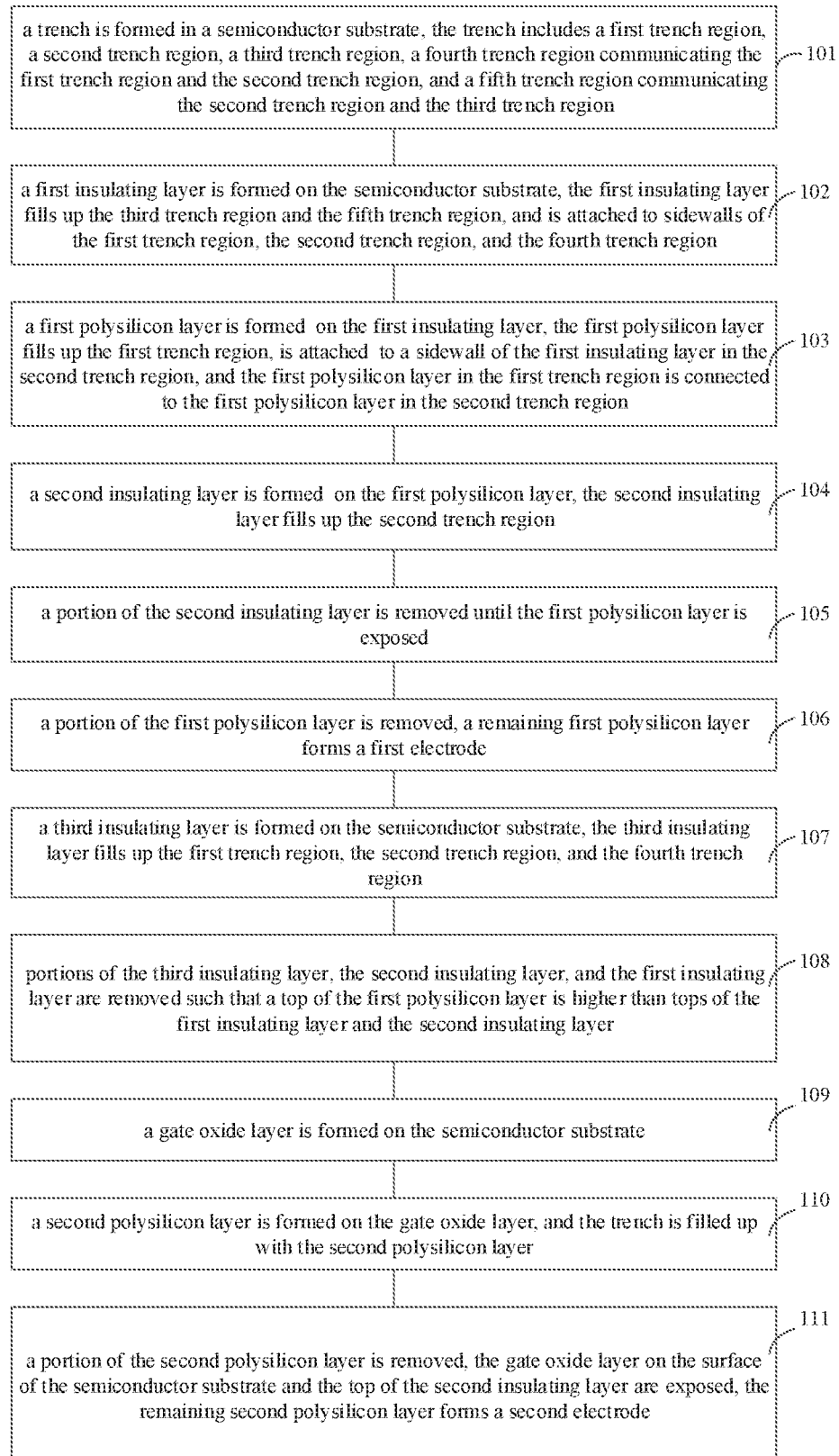
FIG. 1 is a flowchart of a method for manufacturing a VDMOS device according to an embodiment.

In order to address the deficiency of the existing separation gate technology, such as escalating the processing cost and increasing the implementation difficulties of subsequent processes, as shown in FIG. 1, in an embodiment, a method for manufacturing a VDMOS device includes:

In step 101, a trench is formed in a semiconductor substrate, the trench includes a first trench region, a second trench region, a third trench region, a fourth trench region communicating the first trench region and the second trench region, and a fifth trench region communicating the second trench region and the third trench region. The width of the second trench region is greater than the width of the first trench region, the width of the first trench region is greater than widths of the third trench region, the fourth trench region, and the fifth trench region.

Figure 2A:
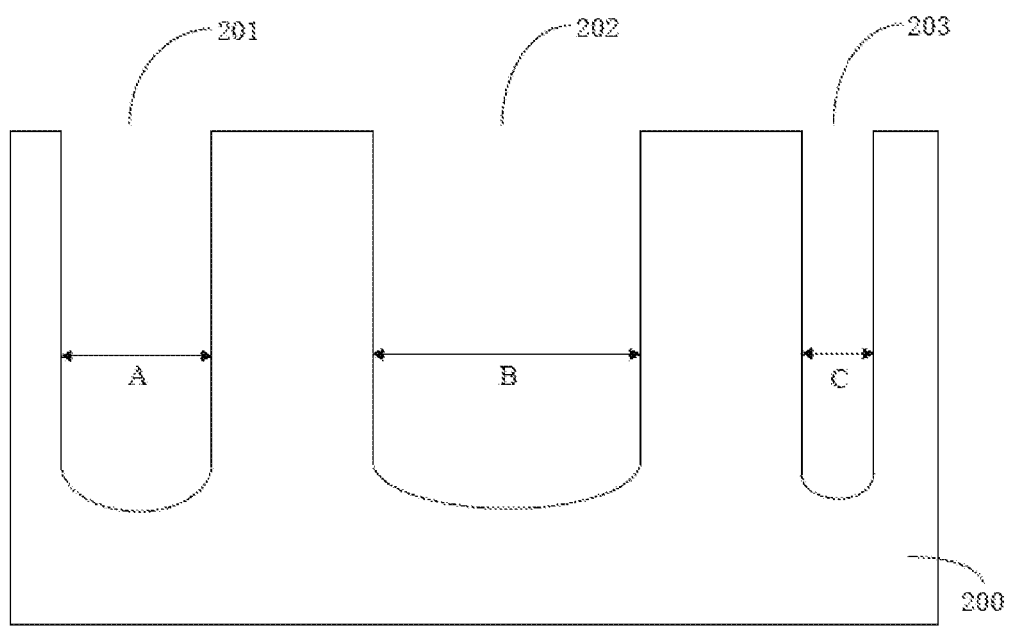
FIGS. 2A to 2I are cross-sectional views of devices respectively obtained by successive steps of The method according to an embodiment.

As shown in FIG. 2A, a semiconductor substrate 200 is provided, and forming material of the semiconductor substrate 200 may use undoped monocrystalline silicon, monocrystalline silicon doped with impurities, Silicon on Insulator (SOI), Stacking Silicon on Insulator (SSOI), Stacking Silicon Germanium on Insulator (S-SiGeOI), Stacking Silicon Germanium on Insulator (SiGeOI) and Germanium on Insulator (GeOI) etc. As an example, in the present embodiment, the forming material of the semiconductor substrate 200 is monocrystalline silicon. An isolation structure is formed in the semiconductor substrate 200, and as an example, the isolation structure is a shallow trench isolation (STI) structure or a local silicon oxide (LOCOS) isolation structure.

Next, a trench is formed in the semiconductor substrate 200. As shown in FIG. 3, the trench includes a first trench region 201, a second trench region 202, a third trench region 203, a fourth trench region 216 communicating the first trench region 201 and the second trench region 202 and a fifth trench region 217 communicating the second trench region 202 and the third trench region 203. The width of the second trench region 202 is much greater than the width of the first trench region 201 which in turn is greater than the widths of the third trench region 203, the fourth trench region 216, and the fifth trench region 217. The width of the third trench region 203 is the same as or similar to the widths of the fourth trench region 216 and the fifth trench region 217. In the cross-sectional views of FIGS. 2A to 2I, only a process in which the first trench region 201, the second trench region 202, and the third trench region 203 form a gate electrode is illustratively shown, respectively, for brevity, the fourth trench region 216 and the fifth trench region 217 are not shown in FIGS. 2A to 2I.

Subsequently, a first electrode serving as a deep gate is formed in the first trench region 201, the second trench region 202, and the fourth trench region 216, and a second electrode serving as a shallow gate is formed in the trench. The width A of the first trench region 201 is greater than the width C of the third trench region 203 to ensure that after the subsequent formation of the first insulating layer on the semiconductor substrate 200, the first insulating layer fills up only the third trench region 203 and the fifth trench region 217. The width B of the second trench region 202 is much greater than the width a of the first trench region 201 to ensure that after the subsequent formation of the first polysilicon layer on the semiconductor substrate 200, the first polysilicon layer fills up only the first trench region 201 and the fourth trench region 216.

The step of forming the trench includes forming a mask layer having the trench pattern on the semiconductor substrate 200, the mask layer may be formed using a conventional photolithography and etching process, the mask layer may be a single layer structure or a multi-layer structure; the mask layer having a single layer structure is a patterned photoresist layer, and the mask layer having a multi-layer structure may include a patterned advanced patterned layer, an anti-reflection coating layer, and a photoresist layer stacked from bottom to top; The semiconductor substrate 200 is etched using the mask layer as a mask, and forming the trench in the semiconductor substrate 200, the etching may be a conventional anisotropic dry etching. The mask layer is removed, and the mask layer is removed by a conventional ashing process; and a wet cleaning is performed to remove by-products and impurities generated by the foregoing etching.

In step 102, a first insulating layer is formed on the semiconductor substrate to ensure that the third and fifth trench regions are filled up, and the first insulating layer is formed on the sidewalls of the first trench region, the second trench region, and fourth trench region without the first trench region, the second trench region, and the fourth trench region being filled up.

Figure 2B:
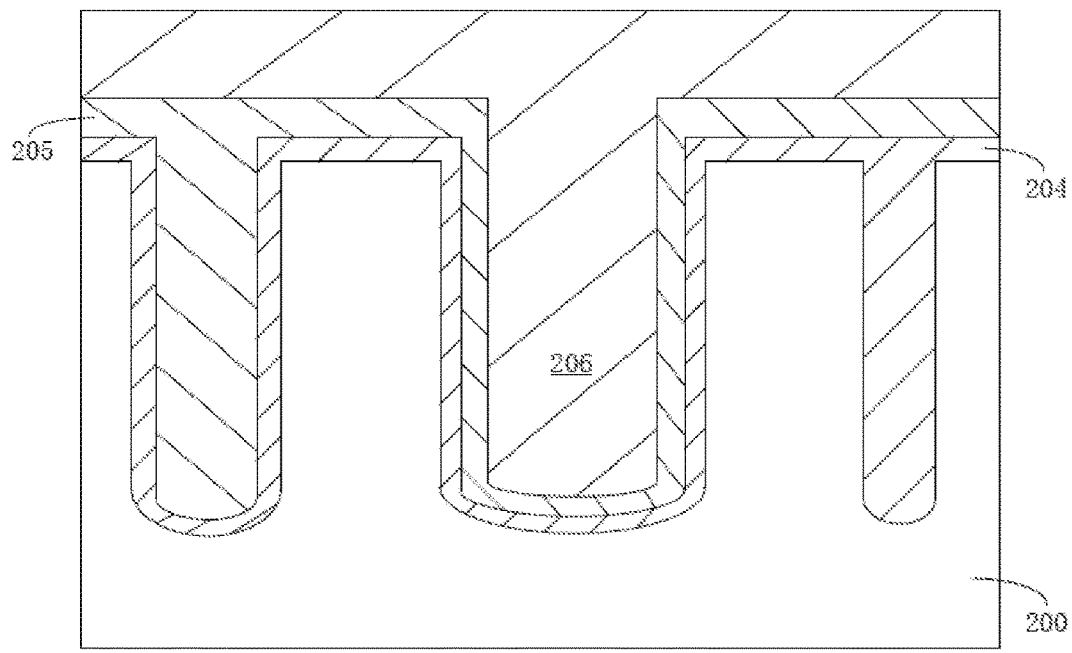
Figure 3:
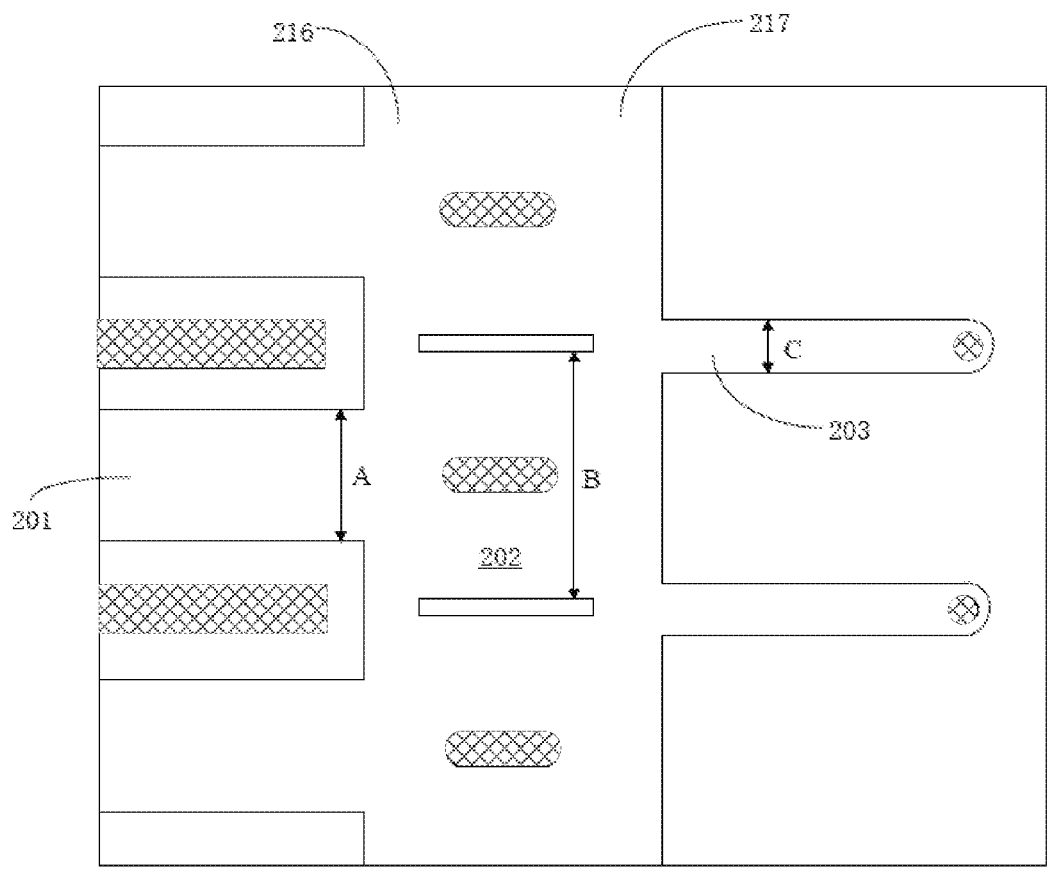
FIG. 3 is a schematic layout of a VDMOS device prepared according to a method of an embodiment.

As shown in FIG. 2B, the first insulating layer 204 is formed on the semiconductor substrate 200 to ensure filling up the third trench region 203 and the fifth trench region. The first insulating layer 204 is formed on the sidewalls of the first trench region 201, the second trench region 202, and the fourth trench region without the first trench region 201, the second trench region 202, and the fourth trench region being filled up. The way of forming the first insulating layer 204 may be any prior art known to those skilled in the art, such as deposition or oxidation growth processes, optionally Chemical Vapor Deposition (CVD), such as Low Temperature Chemical Vapor Deposition (LTCVD), Low Pressure Chemical Vapor Deposition (LPCVD), Rapid Thermal Chemical Vapor Deposition (RTCVD), or Plasma Enhanced Chemical Vapor Deposition (PECVD). The material of the first insulating layer 204 includes an oxide, such as silicon dioxide.

In step 103, a first polysilicon layer is formed on the first insulating layer to ensure that the first trench region is filled up and the second trench region is not filled up, and the first polysilicon layer in the first trench region is connected to the first polysilicon layer in the second trench region.

As shown in FIG. 2B, a first polysilicon layer 205 is formed on the first insulating layer 204 to ensure filling up of the first trench region 201 and the fourth trench region. Since the first insulating layer 204 has filled up the third trench region 203 and the fifth trench region, the first polysilicon layer 205 can only enter the first trench region 201, the second trench region 202, and the fourth trench region. The way of forming the first polysilicon layer 205 may be any prior art known to those skilled in the art, optionally CVD, such as LTCVD, LPCVD, RTCVD, or PECVD.

In step 104, a second insulating layer is formed on the first polysilicon layer to ensure that the second trench region is filled up.

As shown in FIG. 2B, a second insulating layer 206 is formed on the first polysilicon layer 205. Since the first insulating layer 204 has filled up the third trench region 203 and the fifth trench region, the first polysilicon layer 205 has filled up the first trench region 201 and the fourth trench region. The second insulating layer 206 can only enter the second trench region 202. The way of forming the second insulating layer 206 may be any prior art known to those skilled in the art, such as deposition processes, optionally CVD, such as LTCVD, LPCVD, RTCVD, or PECVD. The material of the second insulating layer 206 includes an oxide, such as TEOS.

In step 105, a portion of the second insulating layer is removed until the first polysilicon layer is exposed.

Figure 2C:
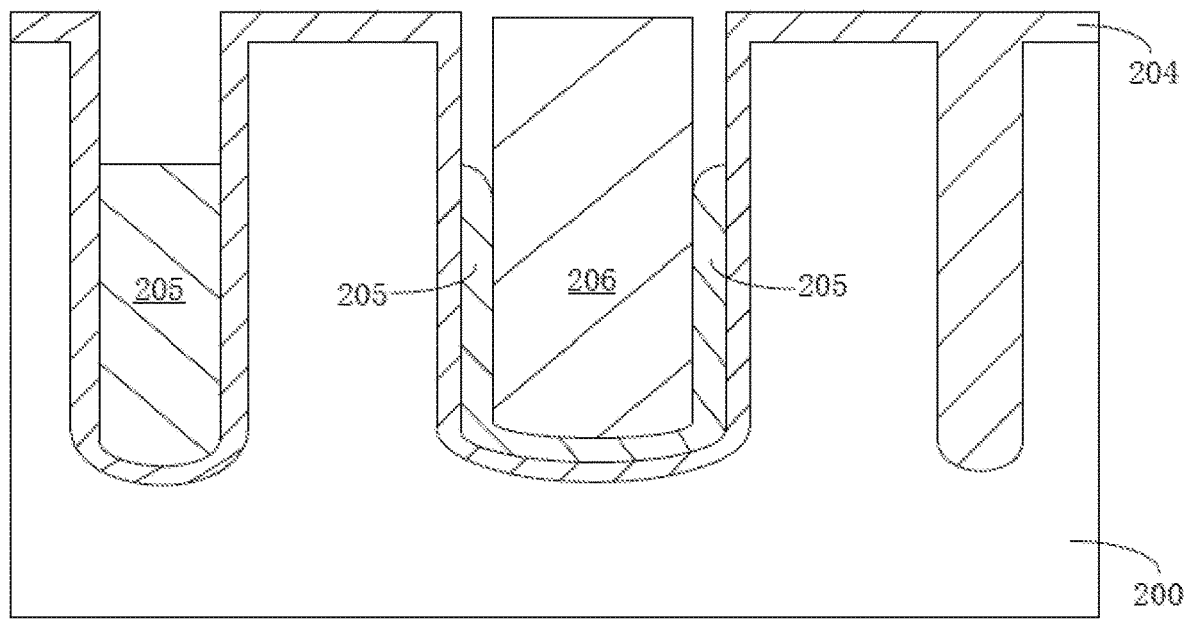

As shown in FIG. 2C, the excess second insulating layer 206 is removed until the first polysilicon layer 205 is exposed. As an example, the excess second insulating layer 206 is removed using an etching process, which may be a wet etching.

In step 106, after a portion of the first polysilicon layer is removed, the remaining first polysilicon layer forms a first electrode.

As shown in FIG. 2C, the excess first polysilicon layer 205 is removed to form a first electrode serving as a deep gate (bottom gate of the cell separation gate). As an example, the excess first polysilicon layer 205 is removed using an etching process, which may be wet etching.

In step 107, a third insulating layer is formed on the semiconductor substrate to ensure that the unfilled up portions of the first trench region, the second trench region, and the fourth trench region are filled up.

Figure 2D:
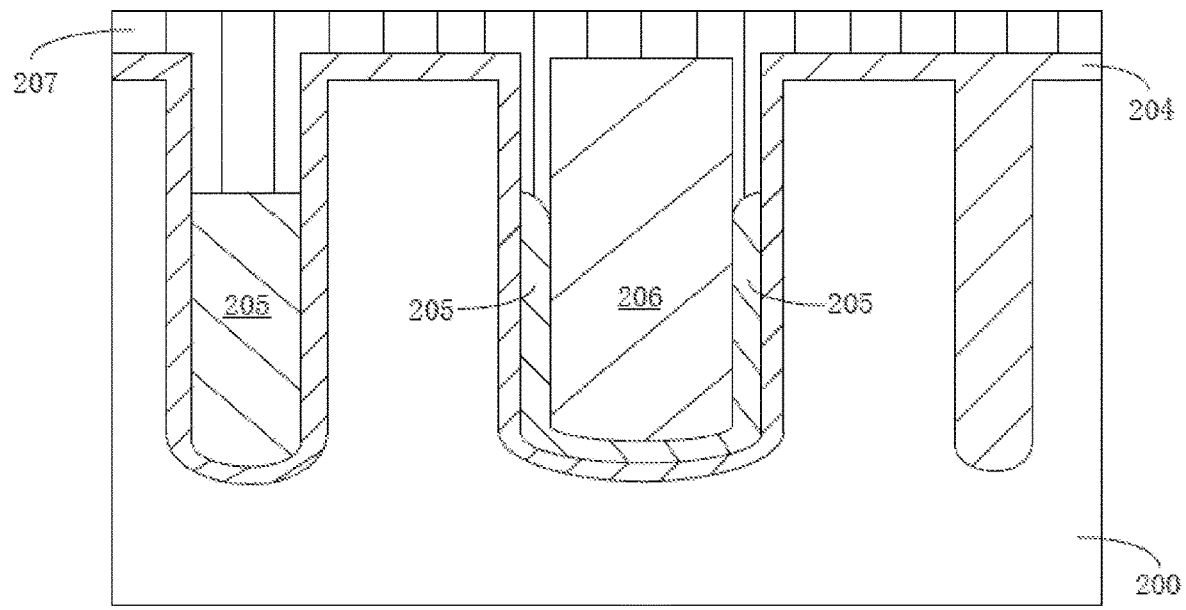

As shown in FIG. 2D, a third insulating layer 207 is formed on the semiconductor substrate 200 to ensure that the unfilled up portions of the first trench region 201, the second trench region 202, and the fourth trench region are filled up. The way of forming the third insulating layer 207 may be any prior art known to those skilled in the art, such as deposition processes, optionally CVD, such as LTCVD, LPCVD, RTCVD, or PECVD. The material of the third insulating layer 206 includes an oxide, such as TEOS.

In step 108, portions of the third insulating layer, the second insulating layer, and the first insulating layer are removed such that a top of the first polysilicon layer is higher than tops of the first insulating layer and the second insulating layer.

Figure 2E:
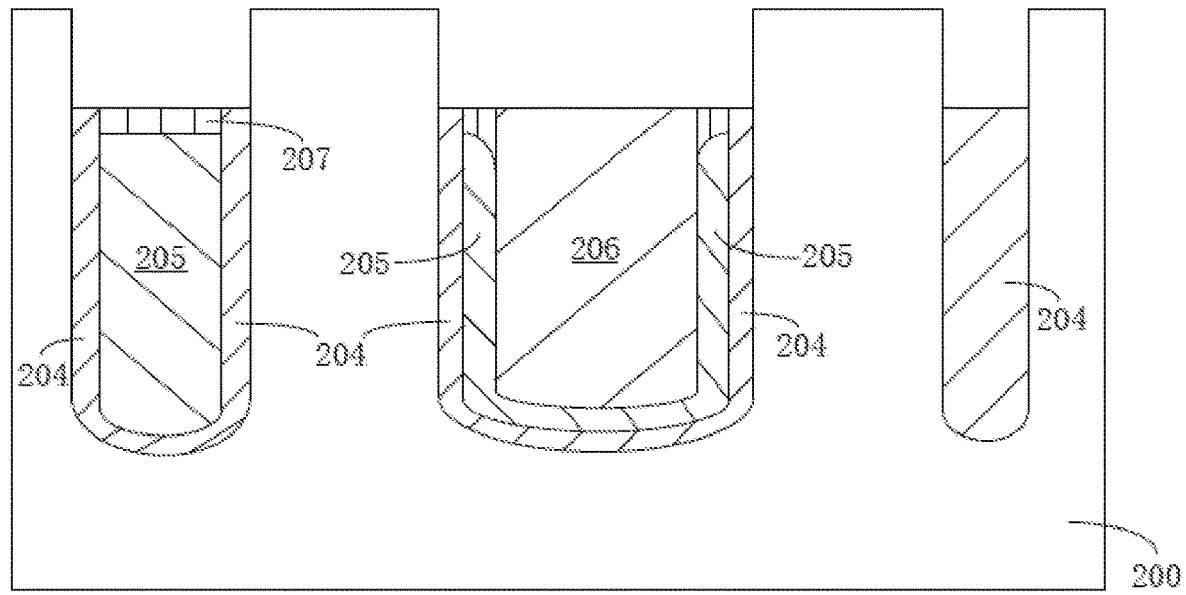

As shown in FIG. 2E, excess third insulating layer 207, first insulating layer 204, and second insulating layer 206 are removed. After removing, the tops of the third insulating layer 207, the first insulating layer 204, and the second insulating layer 206 are flush. The height difference between the top of the first insulating layer 204, the second insulating layer 206, or the third insulating layer 207 and the surface of the semiconductor substrate 200 is determined according to the actual state of the device structure and is not particularly limited herein. As an example, the excess third insulating layer 207, first insulating layer 204, and second insulating layer 206 are removed using an etching process, which may be a wet etching.

Figure 2F:
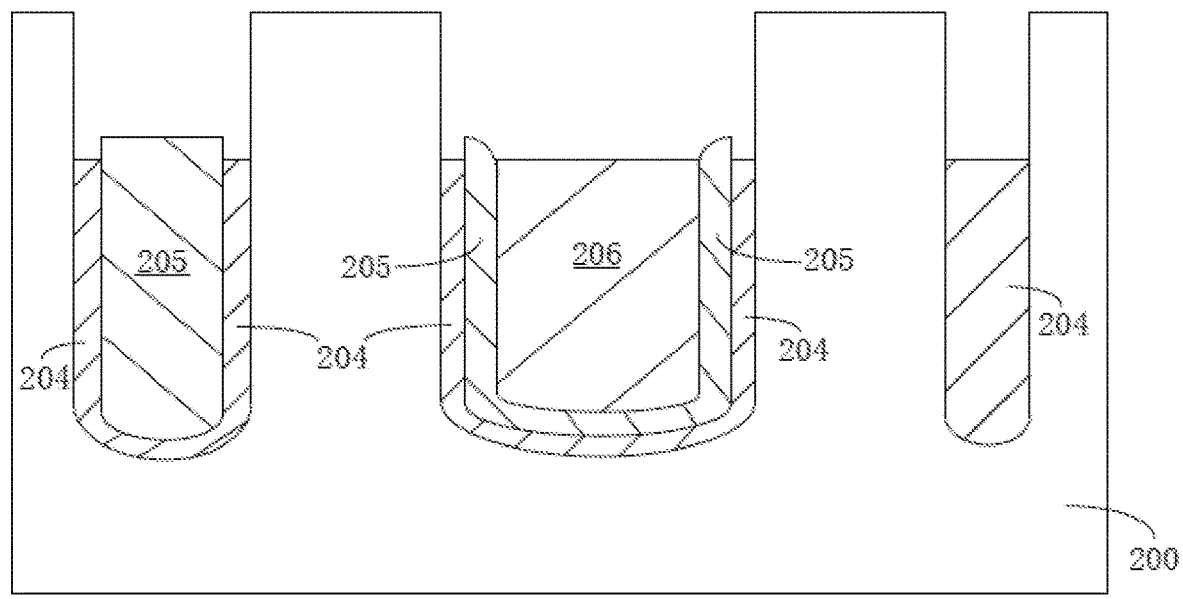

As shown in FIG. 2F, a wet cleaning is performed to remove etching residues and impurities while removing the third insulating layer 207 on the top of the first polysilicon layer 205. After the wet cleaning is performed, the top of the first polysilicon layer 205 is higher than the tops of the first insulating layer 204 and the second insulating layer 206.

In step 109, a gate oxide layer is formed on the semiconductor substrate.

Figure 2G:
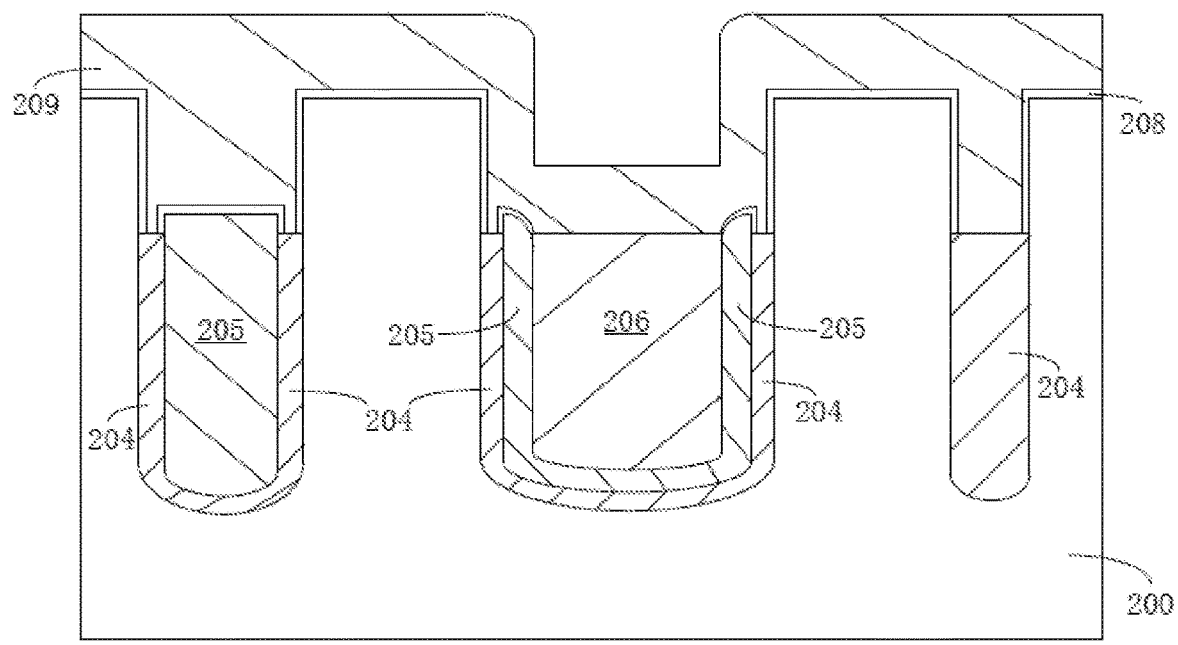

As shown in FIG. 2G, a gate oxide layer 208 is formed to achieve electrical insulation between the first polysilicon layer 205 and the subsequently formed second polysilicon layer 209. As an example, the gate oxide layer 208 is formed using a thermal oxidation or chemical oxidation process. The gate oxide layer 208 is on a surface of the semiconductor substrate 200, a surface of the exposed first polysilicon layer 205, and an exposed sidewall portion of the trench.

In step 110, a second polysilicon layer is formed on the gate oxide layer, and the trench is filled up with the second polysilicon layer.

As shown in FIG. 2G, a second polysilicon layer 209 is formed on the semiconductor substrate 200, and the second polysilicon layer 209 fills up an unfilled up portion of the trench. The way of forming the second polysilicon layer 209 may be any prior art known to those skilled in the art, optionally CVD, such as LTCVD, LPCVD, RTCVD, or PECVD.

In step 111, a portion of the second polysilicon layer is removed, the gate oxide layer on the surface of the semiconductor substrate and the top of the second insulating layer are exposed.

Figure 2H:
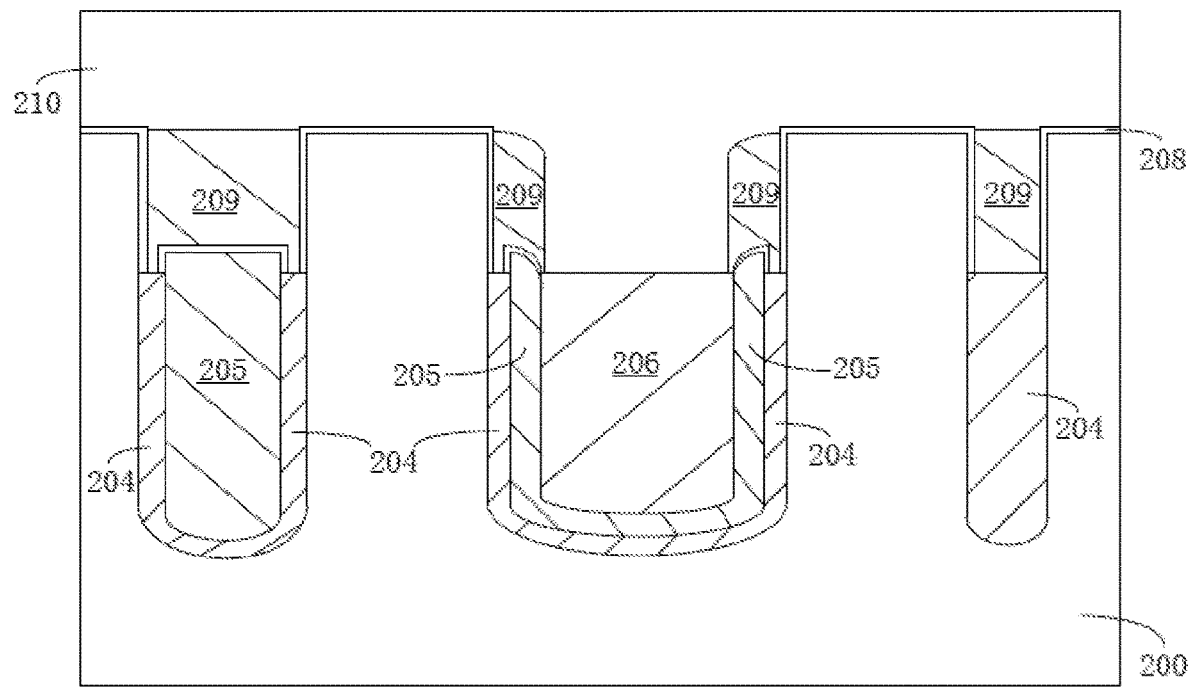

As shown in FIG. 2H, the excess second polysilicon layer 209 is removed, the gate oxide layer 208 on the surface of the semiconductor substrate 200 and the second polysilicon layer 206 in the second trench region 202 are exposed. As an example, the excess second polysilicon layer 209 is removed using an etching process, which may be a wet etching. At this time, the second polysilicon layer 209 formed in the trench forms a second electrode serving as a shallow gate (top lead-out gate). At this time, the gate oxide layer 208 serves as an electrical insulating layer between the first polysilicon layer 205 and the second polysilicon layer 209.

Besides for forming the trench, the photolithography process is not used to forming the first electrode and the second electrode, there is no significant step on the surface of the semiconductor substrate 200 and will not affect the photolithography and etching process performed when the well region and the metal interconnecting layer are subsequently formed.

According to the method for manufacturing the VDMOS device according to the above embodiments, separate leading-out of the first and second electrodes of the gate can be effected, while all of the polysilicon gates remain in the trench. Therefore, there is no obvious step formed on the surface of the product, and the implementation difficulties of subsequent photolithography and etching process are somewhat reduced.

For a thorough understanding of the present disclosure, detailed structures and/or steps are proposed in the following description so as to explain the technical solutions proposed by the present disclosure. The alternative embodiments of the disclosure are described in detail below, however in addition to these detailed description, the disclosure may have other embodiments.

In an embodiment, the method for manufacturing the VDMOS device further includes forming a well region and a source region in the semiconductor substrate 200 through an ion implantation process. The process of forming the well region and the source region is known to those skilled in the art and is omitted for brevity.

In an embodiment, the method for manufacturing the VDMOS device further includes forming an interlayer dielectric layer 210 on the semiconductor substrate 200. As an example, the material of the interlayer dielectric layer 210 is optionally a material having a low dielectric constant. The materials having a low dielectric constant includes, but is not limited to, a Hydrogen Silsesquioxane (HSQ) having a k value of 2.5 to 2.9, a Methyl Silsesquioxane (MSQ) having a k value of 2.2, a Porous Silicon Dioxide formed by way of CVD etc. The interlayer dielectric layer 210 may be formed using any prior art known to those skilled in the art, optionally CVD, such as LTCVD, LPCVD, RTCVD, and PECVD etc.

Figure 2I:
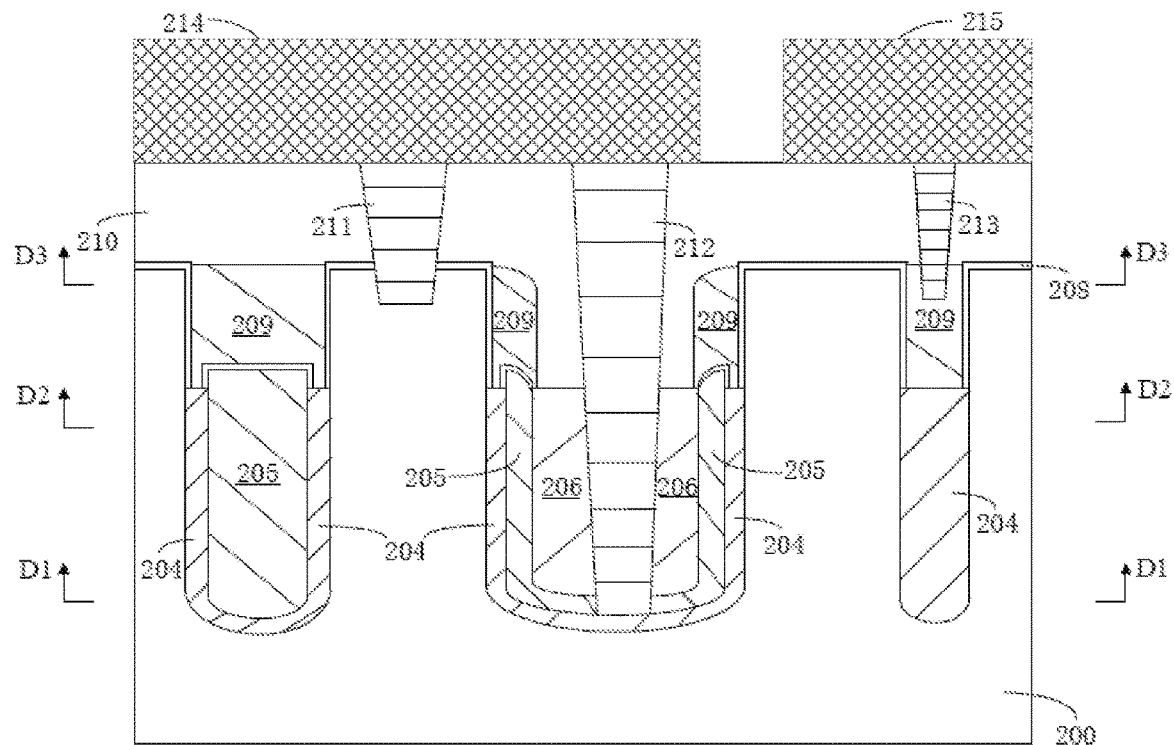

As shown in FIG. 2I, in an embodiment, the method for manufacturing the VDMOS device further includes forming a first contact plug 211, a second contact plug 212, and a third contact plug 213 penetrating the interlayer dielectric layer 210 by photolithography or an etching process. A bottom of the first contact plug 211 is electrically connected to a source region of the cell region. A bottom of the second contact plug 212 is electrically connected to the first polysilicon layer 205 in the second trench region 202. A bottom of the third contact plug 213 is electrically connected to the second polysilicon layer 209 in the third trench region 203. As an example, a mask layer having patterns of the first contact plug 211, the second contact plug 212, and the third contact plug 213 is formed on the interlayer dielectric layer 210, and the exposed interlayer dielectric layer 210 is etched using the mask layer as a mask. A via is formed in the interlayer dielectric layer 210 exposing the tops of the source region in the cell region, the first polysilicon layer 205 in the second trench region 202, and the second polysilicon layer 209 in the third trench region 203, after the mask layer is removed, a metal layer is filled in the via to form the first contact plug 211, the second contact plug 212, and the third contact plug 213.

In an embodiment, the method for manufacturing the VDMOS device further includes forming a first metal layer 214 and a second metal layer 215 that are independent from each other located on the interlayer dielectric layer 210. The tops of the first contact plug 211 and the second contact plug 212 are electrically connected to the first metal layer 214, and the top of the third contact plug 213 is electrically connected to the second metal layer 215.

Figure 2J:
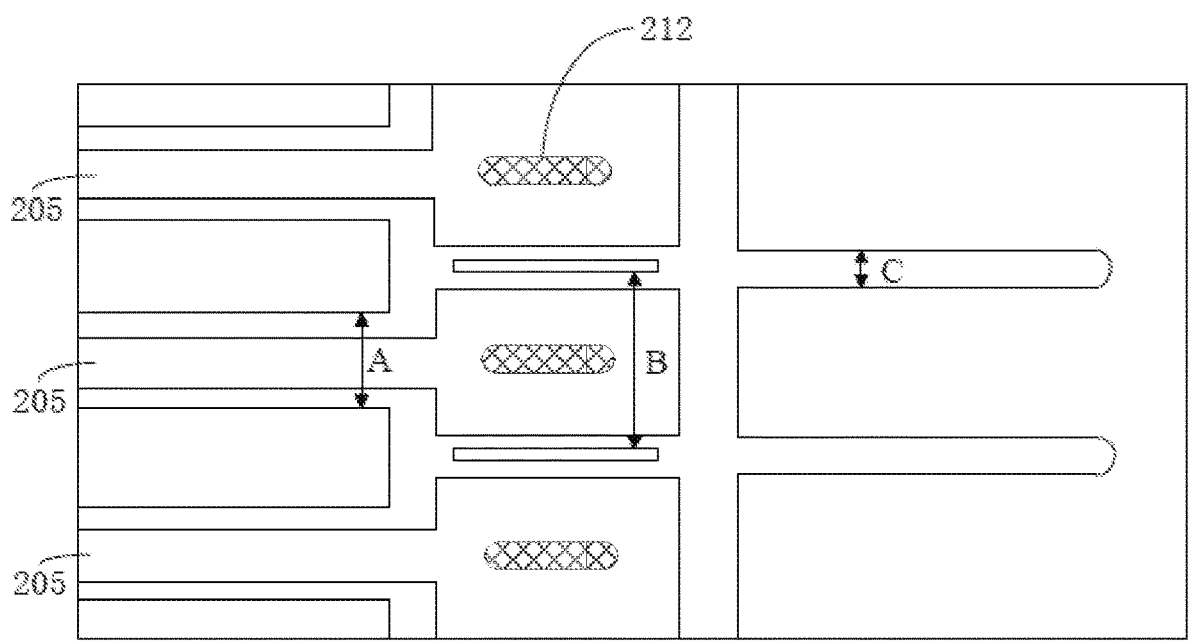
FIG. 2J is a schematic view of a section taken from position D1 in FIG. 2I.

As shown in FIG. 2J, the first polysilicon layer 205 in the first trench region 201 is connected to the first polysilicon layer 205 in the second trench region 202.

Figure 2K:
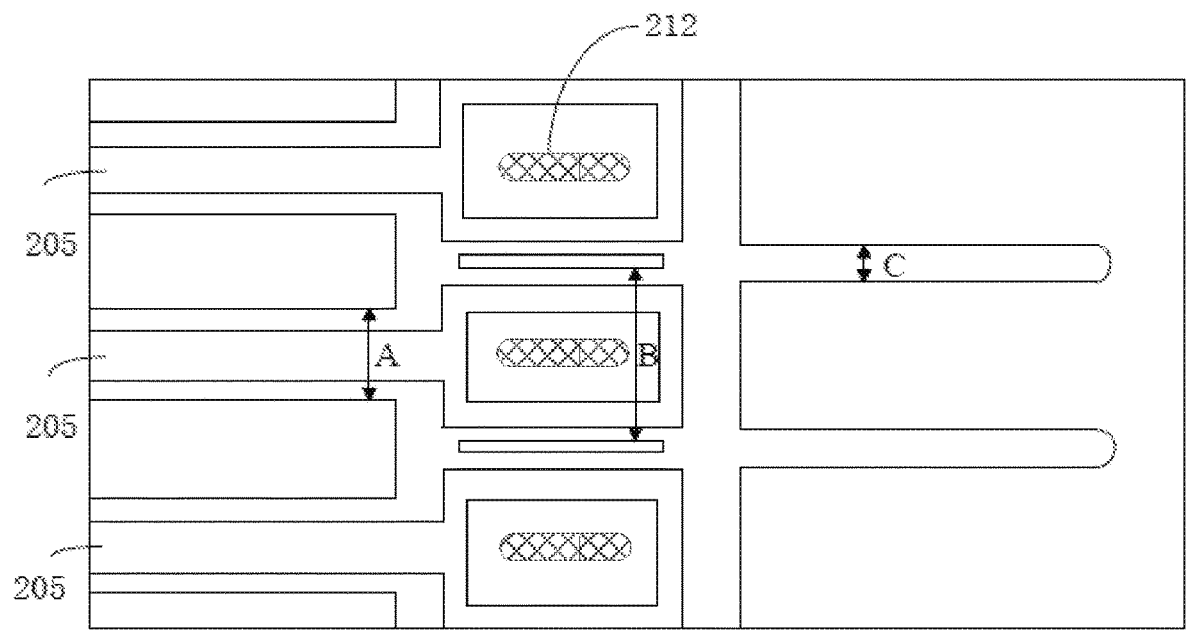
FIG. 2K is a schematic view of a section taken from position D2 in FIG. 2I.

As shown in FIG. 2K, the first polysilicon layer 205 forms a first electrode which includes a columnar first polysilicon layer remaining at the bottom in the first trench region 201 and a barrel-shaped first polysilicon layer remaining at the bottom in the second trench region 202.

Figure 2L:
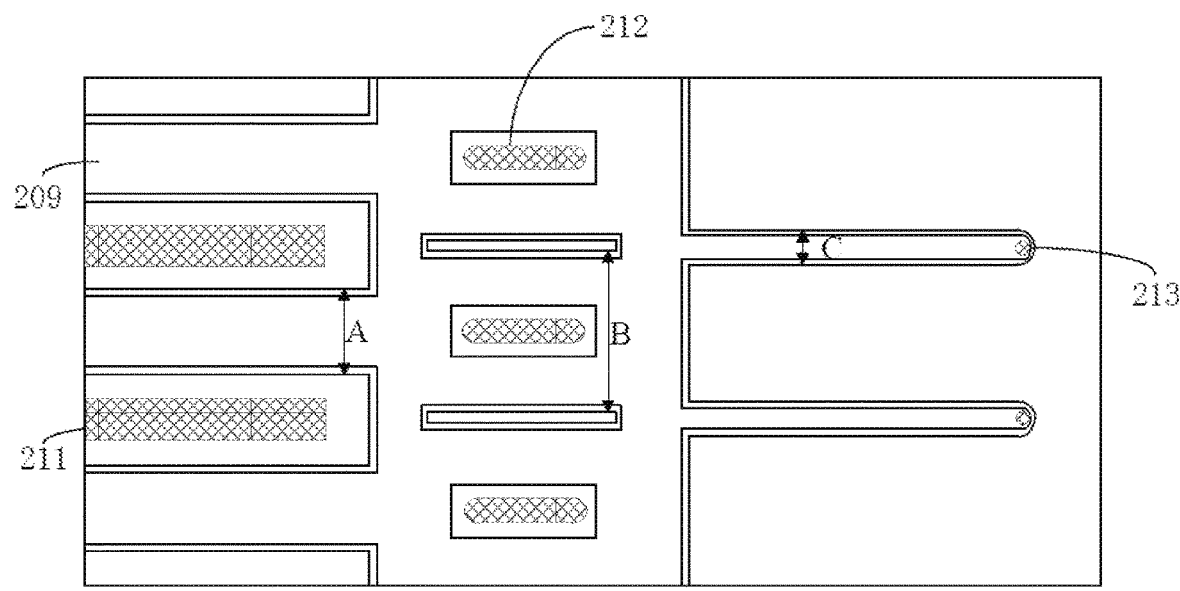
FIG. 2L is a schematic view of a section taken from position D3 in FIG. 2I.

As shown in FIG. 2L, the second polysilicon layer 209 forms a second electrode including a columnar second polysilicon layer remaining at an upper portion in the first trench region 20, an annular second polysilicon layer remaining at an upper portion in the second trench region 202, and a columnar second polysilicon layer remaining at an upper portion in the third trench region 203 are connected to each other.

So far, the processing steps of the method according to an embodiment are completed. It will be appreciated that the method for manufacturing the VDMOS device includes not only the steps described above, but may include other desired steps prior to, among, or after the steps described above, all of which are included within the scope of the present method for manufacturing in the embodiments.

Compared with the prior art, according to the method for manufacturing the VDMOS device proposed in the above embodiments, the separate leading-out of the first and second electrodes of the gate can be effected without increasing the polysilicon lithography layers. Also, all polysilicon gates remain in the trench, so there is no obvious step formed on the surface of the product, and subsequent photolithography and etching processes are less difficult to implement.

As shown in FIG. 2I, a VDMOS device obtained by processing steps according to a method of an embodiment is also provided. The VDMOS device includes a semiconductor substrate 200, an isolation structure is formed in the semiconductor substrate 200, as an example, the isolation structure is a STI structure or a LOCOS isolation structure.

The semiconductor substrate 200 further has a trench formed therein. The trench including a first trench region, a second trench region, a third trench region, a fourth trench region communicating the first trench region and the second trench region and a fifth trench region communicating the second trench region and the third trench region. The width of the second trench region is much greater than the width of the first trench region, the width of the first trench region is greater than the widths of the third trench region, the fourth trench region, and the fifth trench region, and the width of the third trench region is the same as or similar to the widths of the fourth trench region and the fifth trench region.

A first electrode serving as a deep gate is located in the first trench region, the second trench region, and the fourth trench region, and a second electrode serving as a shallow gate is located in the trench. The width of the first trench region is greater than the width of the third trench region to ensure that the subsequent first insulating layer on the semiconductor substrate fills up only the third trench region and the fifth trench region. The width of the second trench region is much greater than the width of the first trench region to ensure that the subsequent first polysilicon layer on the semiconductor substrate fills up only the first trench region and the fourth trench region.

In a semiconductor substrate 200 required to form a VDMOS and defined by the isolation structure, a first trench region-like gate formed by a first polysilicon layer 205 and a second trench region-like gate formed by a second polysilicon layer 209 are formed. The first trench region-like gate forms a first electrode serving as a deep gate, and the second trench region-like gate forms a second electrode serving as a shallow gate. The sidewall of the first trench region-like gate in the first trench region and the fourth trench region is wrapped by the first insulating layer 204, the first trench region-like gate in the second trench region is sandwiched between the first insulating layer 204 and the second insulating layer 206 and is shaped as an "U". A second polysilicon layer 209 is formed on a top of the first trench region-like gate, and a gate oxide layer 208 is formed between the first trench region-like gate and the second polysilicon layer 209 to effect electrical insulation. A first insulating layer 204 is formed under the bottom of the second trench region-like gate.

Specifically, the first trench region includes therein a first electrode serving as a deep gate formed by a first polysilicon layer 205, a first insulating layer 204 wrapping the first electrode, a second electrode serving as the shallow gate formed by the second polysilicon layer 209 on a top of the first electrode and a gate oxide layer 208 between the first electrode and the second polysilicon layer 209.

The second trench region includes therein a first electrode serving as the deep gate formed by a first polysilicon layer 205, a first insulating layer 204 and a second insulating layer 206 separated by the first electrode, a second electrode serving as the shallow gate formed by the second polysilicon layer 209 on a top of the first electrode, and a gate oxide layer 208 between the first electrode and the second polysilicon layer.

The third trench region includes at a bottom thereof a first insulating layer 204, a second electrode serving as a shallow gate formed by the second polysilicon layer 209 on a top of the first insulating layer, and a gate oxide layer 208 wrapping the second electrode.

The fourth trench region includes therein a first electrode serving as a deep gate formed by the first polysilicon layer 205 and a first insulating layer 204 wrapping the first electrode, a second electrode serving as a shallow gate formed by a second polysilicon layer 209 on a top of the first electrode, and a gate oxide layer 208 between the first electrode and the second polysilicon layer 209.

The fifth trench region includes at a bottom thereof a first insulating layer 204, a second electrode serving as a shallow gate formed by a second polysilicon layer 209 on a top of the first insulating layer, and a gate oxide layer 208 wrapping the second electrode.

In an embodiment, the first polysilicon layer 205 in the first trench region 201 and the first polysilicon layer 205 in the second trench region 202 are connected.

In an embodiment, the first polysilicon layer 205 forms a first electrode which includes a columnar first polysilicon layer remaining at a bottom in the first trench region 201 and a barrel-shaped first polysilicon layer remaining at a bottom in the second trench region 202.

In an embodiment, the second polysilicon layer 209 forms a second electrode which includes a columnar second polysilicon layer remaining at an upper portion in the first trench region 201, an annular second polysilicon layer remaining at the upper portion in the second trench region 202, and a columnar second polysilicon layer remaining at an upper portion in the third trench region 203, the three second polysilicon layers are connected to each other.

In the VDMOS device, separate leading-out of the first and second electrodes of the gate can be effected, while all of the polysilicon gate of the VDMOS device remain in the trench, so that there is no obvious step formed thereon the surface of the VDMOS device, the implementation difficulties of the etching process are somewhat reduced.

In an embodiment, the VDMOS device further includes an interlayer dielectric layer 210 on the semiconductor substrate 200. As an example, the material of the interlayer dielectric layer 210 is optionally a material having a low dielectric constant. The materials having a low dielectric constant includes, but is not limited to, a HSQ having a k value of 2.5 to 2.9, a MSQ having a k value of 2.2, a Porous Silicon Dioxide formed by way of CVD etc. The interlayer dielectric layer 210 includes therein a first contact plug 211 whose bottom is electrically connected to a source region of the cell region, a second contact plug 212 whose bottom is electrically connected to the first trench region-like gate in the second trench region, and a third contact plug 213 whose bottom is electrically connected to the second trench region-like gate in the third trench region.

In an embodiment, the VDMOS device further includes a first metal layer 214 and a second metal layer 215 that are independent from each other located on the interlayer dielectric layer 210. The tops of the first contact plug 211 and the second contact plug 212 are electrically connected to the first metal layer 214, and the top of the third contact plug 213 is electrically connected to the second metal layer 215.

The foregoing respective technical features involved in the respective embodiments can be combined arbitrarily; for brevity, not all possible combinations of the respective technical features in the foregoing embodiments are described, however, to the extent they have no collision with each other, the combination of the respective technical features shall be considered to be within the scope of the description.

The foregoing implementations are merely specific the embodiment of the present disclosure, and are not intended to limit the protection scope of the present disclosure. It should be noted that any variation or replacement readily figured out by persons skilled in the art within the technical scope disclosed in the present disclosure shall all fall into the protection scope of the present disclosure. Therefore, the protection scope of the present disclosure shall be subject to the protection scope of the claims.

What is claimed is:

1. A method for manufacturing a VDMOS device, comprising:
    forming a trench in a semiconductor substrate, the trench including a first trench region, a second trench region, a third trench region, and a fourth trench region communicating the first trench region and the second trench region, and a fifth trench region communicating the second trench region and the third trench region; wherein a width of the second trench region is greater than a width of the first trench region, a width of the first trench region is greater than widths of the third trench region, the fourth trench region, and the fifth trench region;
    forming a first insulating layer on the semiconductor substrate, the first insulating layer filling up the third trench region and the fifth trench region, and being attached to sidewalls of the first trench region, the second trench region, and the fourth trench region;
    forming a first polysilicon layer on the first insulating layer, the first polysilicon layer filling up the first trench region, being attached to a sidewall of the first insulating layer in the second trench region, and the first polysilicon layer in the first trench region being connected to the first polysilicon layer in the second trench region;
    forming a second insulating layer on the first polysilicon layer, the second insulating layer filling up the second trench region;
    removing a portion of the second insulating layer until the first polysilicon layer being exposed;

removing a portion of the first polysilicon layer, a remaining first polysilicon layer forming a first electrode;

forming a third insulating layer on the semiconductor substrate, the third insulating layer filling up the first trench region, the second trench region, and the fourth trench region;

removing portions of the third insulating layer, the second insulating layer, and the first insulating layer such that a top of the first polysilicon layer being higher than tops of the first insulating layer and the second insulating layer;

forming a gate oxide layer on the semiconductor substrate;

forming a second polysilicon layer on the gate oxide layer, and the second polysilicon layer filling up the trench; and removing a portion of the second polysilicon layer, exposing the gate oxide layer on the surface of the semiconductor substrate and the top of the second insulating layer, and the remaining second polysilicon layer forming a second electrode.

2. The method according to claim 1, wherein the first electrode comprises a columnar first polysilicon layer remaining at a bottom in the first trench region and a barrel-shaped first polysilicon layer remaining at a bottom in the second trench region, the columnar first polysilicon layer and the barrel-shaped first polysilicon layer are connected.

3. The method according to claim 1, wherein the second electrode comprises a columnar second polysilicon layer remaining at an upper portion in the first trench region, an annular second polysilicon layer remaining at an upper portion in the second trench region and a columnar second polysilicon layer remaining at an upper portion in the third trench region; and the second polysilicon layers in the first trench region, the second trench region, and the third trench region are connected.

4. The method according to claim 1, wherein the forming the gate oxide layer on the semiconductor substrate comprises forming the gate oxide layer on an exposed sidewall of the trench and on the first polysilicon layer.

5. The method according to claim 1, wherein the first insulating layer is formed using a deposition or oxidation growth process, and the second insulating layer and the third insulating layer are formed using a deposition process.

6. The method according to claim 1, wherein the removing is performed by a wet etching process.

7. The method according to claim 1, wherein the step of removing portions of the third insulating layer, the second insulating layer, and the first insulating layer comprises:
removing portions of the third insulating layer, the first insulating layer, and the second insulating layer such that the tops of the third insulating layer, the first insulating layer, and the second insulating layer are flush; and
performing wet cleaning to remove the third insulating layer while causing a top of the first polysilicon layer being higher than tops of the first insulating layer and the second insulating layer.

8. The method according to claim 1, wherein after the removing an excess second polysilicon layer, the method further comprises a step of forming an interlayer dielectric layer on the semiconductor substrate.

9. The method according to claim 8, wherein after removing an excess of the second polysilicon layer, the method further comprises a step of forming a well region and a source region in the semiconductor substrate.

10. The method according to claim 9, further comprising:
forming a first contact plug, a second contact plug, and a third contact plug penetrating the interlayer dielectric layer, wherein a bottom of the first contact plug is electrically connected to a source region of the cell region; a bottom of the second contact plug is electrically connected to the first polysilicon layer in the first trench region; and a bottom of the third contact plug is electrically connected to the second polysilicon layer in the second trench region.

11. The method according to claim 10, further comprising forming a first metal layer and a second metal layer that are independent from each other located on the interlayer dielectric layer, tops of the first contact plug and the second contact plug are electrically connected to the first metal layer, and a top of the third contact plug is electrically connected to the second metal layer.

12. The method according to claim 1, wherein the first electrode forms a deep gate, the second electrode forms a shallow gate, and the first electrode and the second electrode are electrically insulated by the gate oxide layer.

13. A VDMOS device, comprising:
a semiconductor substrate comprising a trench, the trench comprising a first trench region, a second trench region, a third trench region, a fourth trench region communicating the first trench region and the second trench region, and a fifth trench region communicating the second trench region and the third trench region; wherein a width of the second trench region is greater than a width of the first trench region, the width of the first trench region is greater than widths of the third trench region, the fourth trench region, and the fifth trench region;
the first trench region comprising therein a first electrode serving as a deep gate formed by a first polysilicon layer, a first insulating layer wrapping the first electrode, a second electrode serving as a shallow gate formed by a second polysilicon layer on a top of the first electrode, and a gate oxide layer between the first electrode and the second polysilicon layer;
the second trench region comprising therein a first electrode serving as a deep gate formed by a first polysilicon layer, a first insulating layer and a second insulating layer separated by the first electrode, a second electrode serving as a shallow gate formed by a second polysilicon layer and on a top of the first electrode, and a gate oxide layer between the first electrode and the second polysilicon layer;
the third trench region comprising at a bottom thereof a first insulating layer, a second electrode serving as a shallow gate formed by a second polysilicon layer on a top of the first insulating layer, and a gate oxide layer wrapping the second electrode;
the fourth trench region comprising therein a first electrode serving as a deep gate formed by a first polysilicon layer and a first insulating layer wrapping the first electrode, a second electrode serving as a shallow gate formed by a second polysilicon layer on a top of the first electrode, and a gate oxide layer between the first electrode and the second polysilicon layer; and
the fifth trench region comprising at a bottom thereof a first insulating layer, a second electrode serving as a shallow gate formed by a second polysilicon layer on a top of the first insulating layer, and a gate oxide layer wrapping the second electrode.

14. The VDMOS device according to claim 13, further comprising an interlayer dielectric layer located on the semiconductor substrate; the interlayer dielectric layer is provided therein a first contact plug, a second contact plug, and a third contact plug, wherein a bottom of the first contact plug is electrically connected to a source region of a cell region, a bottom of the second contact plug is electrically connected to the first polysilicon layer in the first trench region, and a bottom of the third contact plug is electrically connected to the second polysilicon layer in the second trench region.

15. The VDMOS device according to claim 13, further comprising a first metal layer and a second metal layer which are located on the interlayer dielectric layer and are independent from each other, wherein tops of the first contact plug and the second contact plug are respectively electrically connected to the first metal layer, and a top of the third contact plug is electrically connected to the second metal layer.

* * * * *